United States Patent [19]

Poujois

[11] 3,810,031

[45] May 7, 1974

[54] INTEGRATED AMPLIFYING DEVICE HAVING LOW DRIFT AND METHOD OF COMPENSATING FOR THE DRIFT OF AN AMPLIFYING DEVICE

[75] Inventor: Robert Poujois, Grenoble, France

[73] Assignee: Commissariat A L'Energie Atomique, Paris, France

[22] Filed: May 16, 1972

[21] Appl. No.: 253,771

[30] Foreign Application Priority Data

May 19, 1971 France ............................ 71.18265

[52] U.S. Cl. ...................... 330/9, 330/30 D, 330/35

[51] Int. Cl. ............................................ H03f 1/02

[58] Field of Search .......... 330/9, 35 D, 69, 35, 149

[56] References Cited

UNITED STATES PATENTS 3,263,177 7/1966 Durrett ................................ 330/9

3,649,924 3/1972 Lucas.................................... 330/9

FOREIGN PATENTS OR APPLICATIONS 1,549,197 11/1968 France .................................. 330/9

*Primary Examiner*—Herman Karl Saalbach

*Assistant Examiner*—James B. Mullins

*Attorney, Agent, or Firm*—Lane, Aitken, Dunner & Ziems

[57] ABSTRACT

The device comprises *n* amplifying stages placed in cascade and each comprising means for storing a value substantially proportional to the offset voltage of each stage and compensating for the offset voltage, and means for periodic control of the storage and compensation means. Storage and compensation operations are carried out on the one hand successively stage by stage in order that one stage should compensate for the imperfections of storage of the preceding stage and, on the other hand, for a period of very short duration compared with the time interval which elapses between two successive operations. The input of the first stage constituting the input of the device is provided with at least one switch for connecting said input to ground during the storage and compensation operation.

8 Claims, 5 Drawing Figures

INTEGRATED AMPLIFYING DEVICE HAVING LOW DRIFT AND METHOD OF COMPENSATING FOR THE DRIFT OF AN AMPLIFYING DEVICE

This invention relates to an amplifying device of integrable type and having low drift. An electronic device is said to be integrated when all its components such as transistors MOS, resistors and capacitors are formed by deposit, spreading or grafting, on a substrate which is usually of semiconductor material. The connections between the different elements result in the final construction of the device which is contemplated. The amplifying device which is proposed can be constructed by means of techniques which are conventional in microelectronics and therefore has very small dimensions. The invention is also directed to a method of compensation for drift of an amplifying device.

When the input of an amplifier is connected to ground (earth), its output should be at a voltage of zero value. In practice, it is found that this is not the case at all: the voltage observed at the output of the amplifier is not zero and generally constitutes the drift (false zero) of the amplifier. The value of this output voltage is customarily brought back to a value corresponding to the input of the amplifier the value of the voltage observed at the output is therefore divided by the voltage gain of the amplifier. This voltage which is restored to the input of the amplifier and changed in polarity is referred-to as the offset voltage. This latter is therefore the voltage which must necessarily be applied to the input of an amplifier in order that its output should be at a zero voltage. The cause of said offset voltage lies in the lake of reproducibility of some electronic components in the amplifier.

Amplifiers fitted with means providing compensation for the offset voltage are already known. In these devices, the input of the amplifier is connected to ground, the offset voltage is collected and placed in a memory or storage device, whereupon said voltage undergoes a change of sign and is then re-injected at the input of the amplifier after said input has been disconnected from ground. The storage function is usually performed by a capacitor. Moreover, the storage and compensation for the offset voltage entail the need to employ switches and, as will be shown hereinafter, the control of the opening and closing of said switches produces electric parasites, with the result that the compensation for the offset voltage cannot be carried out satisfactorily in a large number of applications.

The present invention proposes an integrated amplifying device having low drift and corresponding to practical requirements more effectively than those of the prior art, particularly as perfect compensation can be provided for the offset voltage of said device.

Accordingly, this invention proposes an amplifying device of integrable type and having low drift, characterized in that it comprises $n$ amplifying stages placed in cascade and each comprising an amplifier having an inherent offset voltage, means for storing a value substantially proportional to said offset voltage and compensating for said offset voltage and means for periodic control of said storage and compensation means, the storage and compensation operations being carried out on the one hand successively stage by stage in such manner that one stage should be capable of compensating for the imperfections of storage of the preceding stage and on the other hand for a period of very short duration compared with the time interval which elapses between two successive storage operations, and the input of the first stage constituting the input of said device being provided with at least one switch for connecting said input to ground during said storage and compensation operation.

Said amplifiers can advantageously be of the differential type and said switches can be MOS transistors. The amplifying device is advantageously constructed in accordance with the MOS technology.

A better understanding of this invention will be obtained from the following description of embodiments of the invention which are given by way of explanatory examples but not in any limiting sense, reference being made to the accompanying drawings, wherein.

Figure 1:
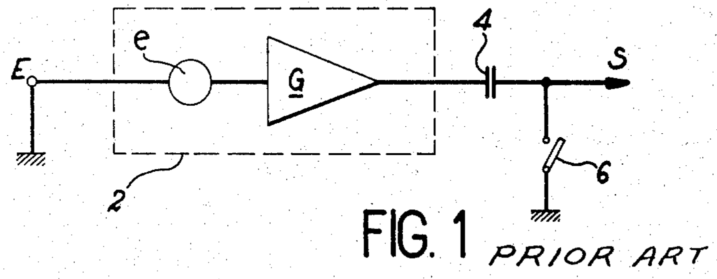
FIG. 1 PRIOR ART
FIG. 1 shows diagrammatically a method for storing and compensation for the offset voltage.
Figure 2:
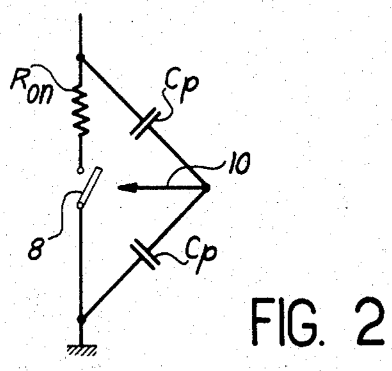
FIG. 2 shows the circuit diagram which is equivalent to a switch.

In FIG. 1, which represents diagrammatically an amplifier providing storage and compensation for the offset voltage, this device being usually designated as a storage amplifier, said device is constituted by an amplifier 2 having a gain G and an offset voltage $e$, storage means constituted in this case by a capacitor 4 which is placed between the output S of the device and the output of the amplifier 2, and a switch 6 connected between the output S and ground. If the input E is connected to ground and if the switch 6 is in the open position, the output S would be at a voltage having a value $Ge$ in the absence of the capacitor 4. By closing the switch 6 and in the presence of the capacitor 4, this latter is charged to a voltage Ge, which corresponds to the operation involving storage of a value which is proportional to the offset voltage $e$, at a coefficient G. By opening the switch 6, the electric charges stored in the capacitor 4 and representing a voltage $Ge$ will nullify the voltage $Ge$ at the output of the amplifier 2; this operation corresponds to compensation for the offset voltage. In this case, the output S is then at a voltage of zero value with due allowance for variations in noise of the amplifier. An amplifier providing storage and compensation for the offset voltage has thus been produced. This known device is attended by a large number of disadvantages, among which can be mentioned in particular the presence of the switch 6. Control of the opening and closure of said switches produces parasitic electric pulses at the output S, with the result that the offset voltage of the amplifier is no longer compensated in an effective manner. Perfect switches do not exist and FIG. 2 shows the real diagram of a switch. This latter comprises the switch 8 proper, a control circuit 10 and two parasite capacitors having an equal value $C_p$ and connected in parallel with said switch 8. When the switch is in a closed position, it possesses a resistance $R_{on}$. When it is desired to compensate for the offset voltage after storing this latter in the capacitor 4, the switch 6 is controlled in such manner as to place this latter in an open position. The control signal applied at 10 passes into the parasite capacitor $C_p$ and induces at the output S a voltage having a value $\epsilon$. The offset voltage $e$ is then no longer strictly compensated inasmuch as the output S is at a voltage having a value $\epsilon$. In practice, $\epsilon$ is not negligible. In fact, by way of example, if it is assumed that the control signal is 20 volts and that it is desired to have $\epsilon$ 1 mV, it is necessary to attenuate the control signal by a factor of 20,000. Since the capacitor 4 and the parasite capacitor $C_p$ are connected in series, it is necessary in the example mentioned to ensure that the capacitor 4 should have a value 20,000 times higher than $C_p$. In integrated circuits and in the MOS technology, for example, the values of capacitance which can readily be achieved in the present state of knowledge are in the vicinity of 5 picofarads. It would accordingly be necessary to have $C_p =$ 5/20,000 pF. The construction of switches having parasite capacitances $C_p$ of this low order is at present impossible since the minimum value which can be attained is $C_p$ 0.05 pF. When the amplifier is constructed of discrete components, for example, higher values than those mentioned above may naturally be chosen for the capacitor 4. However, the charging time of this capacitor is much longer and the time required for the operation involving storage and compensation for the offset voltage is substantially increased, with the result that the time of utilization of the amplifier is reduced accordingly.

Figure 3:
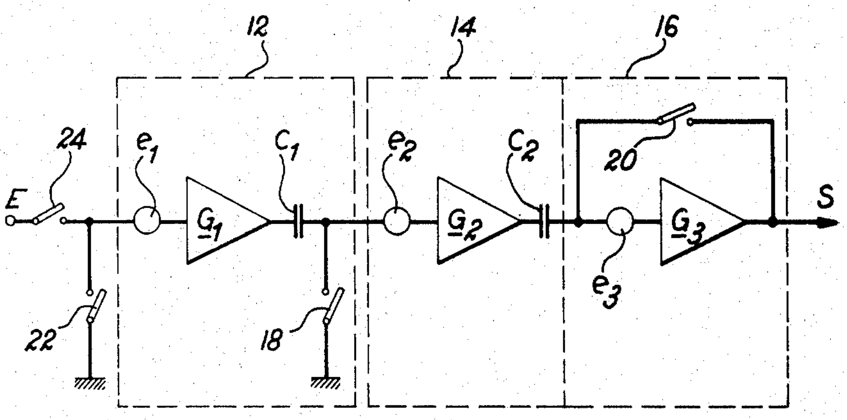
FIG. 3 is a diagrammatic presentation of the invention.

The amplifying device in accordance with the invention as illustrated diagrammatically in FIG. 3 can have a very high gain which can be practically of any desired value and makes it possible to overcome the problems of parasitic disturbances caused by switches. This device comprises two amplifier stages which are connected in cascade and designated by the reference numerals 12 for the first and 14 and 16 for the second. The first stage 12 and the portion 14 of the second stage each comprise an amplifier having a gain respectively of $G_1$ or $G_2$ and an offset voltage $e_1$ or $e_2$ and a capacitor $C_1$ or $C_2$. The first stage 12 comprises a switch 18. The portion 16 of the third stage consists solely of an amplifier having a gain $G_3$ and an offset voltage $e_3$, said amplifier being wholly in negative feedback by means of the switch 20 and solely during the storage operation, the gain of this stage 16 being at that moment equal to 1. The device can clearly comprise $n$ stages, the first stages of the order $(n-1)$ having structures which are identical with the type 12 and the last stage $n$ being identical with the stage composed of the two portions 14 and 16. The input E of the device can be connected by means of a switch 24 to the input of the first stage and to ground by means of a switch 22. The input impedance of the three amplifier stages is of high value. It will be assumed that, at the outset, the switch 24 is open and that the switches 22, 18 and 20 are closed, which corresponds to storage of the offset voltages. In a first step, the switch 18 is opened. Compensation for the offset voltage of the first amplifier stage 12 is thus effected in the manner indicated earlier. The voltage $G_1e_1$ is accordingly compensated by the charge of the capacitor $C_1$. However, the opening of the switch 18 produces a parasitic voltage having a value $\epsilon$ which appears at the output of the first amplifier stage 12. The capacitor $C_2$ of the following amplifier stage 14 will store, not the voltage $G_2e_2$, but a voltage equal to $[G_2(e_2+\epsilon)+e_3]$. This last-mentioned voltage is therefore strictly compensated by the capacitor $C_2$, thus nullifying the effect of the parasite $\epsilon$ which is produced by the opening of the switch 18. In a second step, the switch 20 is opened, thereby producing as before a parasitic voltage $\epsilon$ at the output of the amplifying portion 14. At the input of the portion 16, the voltage is not zero but has a value $\epsilon$. The voltage at the output S of the device, when its input E is connected to ground as a result of closure of the switch 22, is therefore at a voltage equal to $e_3$, namely the natural offset voltage of the amplifier of stage 16, to which is added the voltage $G_3\epsilon$ resulting from the opening of the switch of the preceding stage. The offset voltage of the device, this voltage being always brought back to the input of said device, is therefore equal to:

$$(e_3 + \epsilon \cdot G_3/G_1 \cdot G_2 \cdot G_3)$$

In the case of a device comprising $n$ amplifier stages having successive gains $G_1, G_2, \ldots\ldots\ldots, G_{n+1}$ and $G_n$, the offset voltage of the last stage being equal to $e_n$, the offset voltage of the amplifier device is equal to:

$$(e_n + \epsilon\, G_n/G_1 \cdot G_2 - - - , \cdot G_n)$$

It is therefore possible on the one hand to provide a total gain for the amplifying device which is as high as may be desired and, on the other hand, to reduce the off-set voltage to the smallest value which may be found necessary. It should be pointed out that compensation for the offset voltages of the different amplifier stages is carried out successively by opening first the switch 18, then the switch 20.

In practice, the output S of the device cannot possibly be coupled with a capacitor which is placed in series with the amplifier of the last stage. Storage and compensation for the offset voltage of this stage is therefore not feasible; for this reason, it is an advantage, although not necessary, to place the output of the amplifier of the last stage in total negative feedback with its input during the storage operation in order to reduce the apparent offset of this stage. For example, in the case of FIG. 3, if the last stage were not in total negative feedback, the offset voltage would be equal, not to $(e_3 + \epsilon\, G_3)/G, G_2\, G_3$ but to $(e_3 + \epsilon)/G_1\, G_2$, this value being much higher.

When the operation of storage and compensation for the offset voltages of the different successive stages has been completed, the amplifying device is employed by opening the switch 22 and by closing the switch 24. This opening and closure produce parasitic voltages which are partially counterbalanced. The time of utilization of the device must clearly be very substantial with respect to the time which is necessary for the storage and compensation operation. This latter is carried out fr the entire device in a periodic manner. Since the values of the capacitors $C_1$ and $C_2$ are very low, their charging times are very short and the storage operation lasts only a very short time. By way of example, the storage and compensation operations can each require a time interval of 1 microsecond and can be carried out with a frequency of 1 kc/s, which leaves a time of utilization of the amplifying device of 1 millisecond.

A further advantage of this device which results from the periodicity of the storage and compensation operations lies in the removal of part of the background noise of the device as a result of elimination of frequencies lower than the frequency of the storage and compensation operations. In fact, if the frequency of these operations is 1 kc/s, for example, the amplifying device will not wholly transmit frequencies below 1 kc/s.

Figure 4:
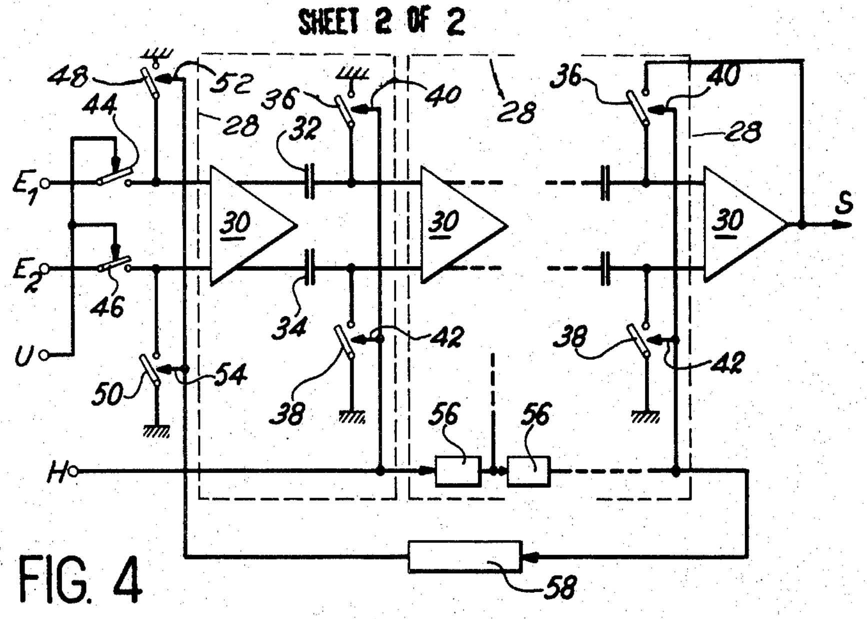
FIG. 4 shows one advantageous embodiment of the amplifying device according to the invention.

It is known that amplifiers which have one input and one output are highly sensitive to external electric parasites and that it is an advantage in practice to make use of differential amplifiers, that is to say which have two inputs and two outputs of opposite polarity, one input of predetermined polarity corresponding to one output having the same polarity. A parasite which arrives at both inputs at the same time is compensated by reason of the opposite polarity of said inputs and is consequently eliminated. The embodiment of the invention which is illustrated in FIG. 4 makes use of $(n-1)$ amplifier stages 28 having the same structure and each comprising a differential amplifier 30 having a gain G and a natural offset voltage $e$, each of the two channels of the amplifier being connected to a capacitor 32 or 34 having the same value in the case of the first stages of the order $(n-1)$. The output of each of the two channels of said $(n-1)$ first stages can be connected to ground by means of a switch 36 or 38 controlled by means 40 or 42. Since the capacitors 32 and 34 are identical, their leakage currents have substantially the same value. This characteristic feature is of great advantage by reason of the fact that, since these equal leakage currents produce equal voltage drops at the terminals of the capacitors 32 and 34, the offset voltage can accordingly be compensated more effectively inasmuch as said voltage drops are of opposite polarity and cancel each other. The last stage $n$ is in fact made up of a first portion constituted by a stage 28 and of a second portion comprising a single amplifier 30 provided with a single output which is placed in total negative feedback with one of its two inputs. The two inputs $E_1$ and $E_2$ of the amplifying device can each be connected directly to one of the two inputs of the first amplifier stage 28 by means of the switches 44 and 46 and to ground by means of the switches 48 and 50 provided with control means designated respectively by the references 52 and 54. The two input switches 48 and 50 as well as the switches 36 and 38 of one and the same stage are controlled in synchronous manner and in pairs (stage by stage). In order to achieve this result, an input H which receives recurrent signals, namely clock signals of the means for controlling the opening and closure of the switches, is connected in parallel with each group of two switches 48–50 and 36–38. Moreover, in order to ensure that the storage and compensation operations of the different amplifier stages are carried out successively, the two groups which are each constituted by two switches 36 and 38 forming part of two successive stages 28 are connected by means of a delay circuit 56 which ensures displacement in time of the opening and closure of the groups of switches 36 and 38. A delay circuit 58 which is connected in series with the delay line 56 of the stage of the order $(n-1)$ permits control of the means 52 and 54 for the opening and closure of the two input switches 48 and 50. The two inputs $E_1$ and $E_2$ of the amplifying device can be put into service simultaneously by causing operation of the switches 44 and 46 by means of recurrent electric signals applied to the input U.

The operation of the amplifying device of FIG. 4 is as follows. Assuming that the two inputs $E_1$ and $E_2$ are employed (utilization of the device) or, in other words, that the two switches 44 and 46 are in a closed position (conducting direction) and that all the other switches 48, 50, 36 and 38 are open: under these conditions, the amplifying device is in its utilization phase or, in other words, restores after amplification the signals which are applied simultaneously to said two inputs $E_1$ and $E_2$. At the end of a predetermined operating time referred-to as the utilization time, it becomes necessary to carry out a storage and compensation for the offset voltages of the different amplifier stages. There is then sent on the one hand to the input U an electric signal which places the switches 44 and 46 in an open position and on the other hand to the input H a signal which places the two input switches 48 and 50 as well as the different switches 36 and 38 of the successive amplifier stages in a closed position. This stage corresponds to storage in the capacitors 32 and 34 of a value which is proportional to the offset voltage of each amplifier stage 28. The transmission of a second electric signal to the input H has the effect of placing the switches 36 and 38 of the different amplifier stages 28 in an open position and this is carried out stage by stage by means of the delay circuits 56 and then placing the two switches 48 and 50 in an open position by means of the delay circuit 58. This stage corresponds to compensation for the offset voltage of the different amplifier stages 28. The amplifying device can then be utilized by application of an electric signal to the input U, which has the effect of placing the two switches 44 and 46 in a closed position.

By way of example, an amplifying device which is constructed according to the diagram of FIG. 4 and comprises three amplifier stages, the successive gains of the amplifiers 30 being equal to 100, 50 and 50 (this latter being placed in total negative feedback) and the values of the capacitors 32 and 34 being equal to 5 picofarads, the storage and compensation operation requires approximately 0.25 microsecond and the time of utilization of the amplifying device is in the vicinity of 50 milliseconds. This utilization time is wholly sufficient since the presence of the low-frequency background noise makes it necessary to employ the amplifying device for a period of less than one millisecond in order to reduce the low-frequency noise.

Figure 5:
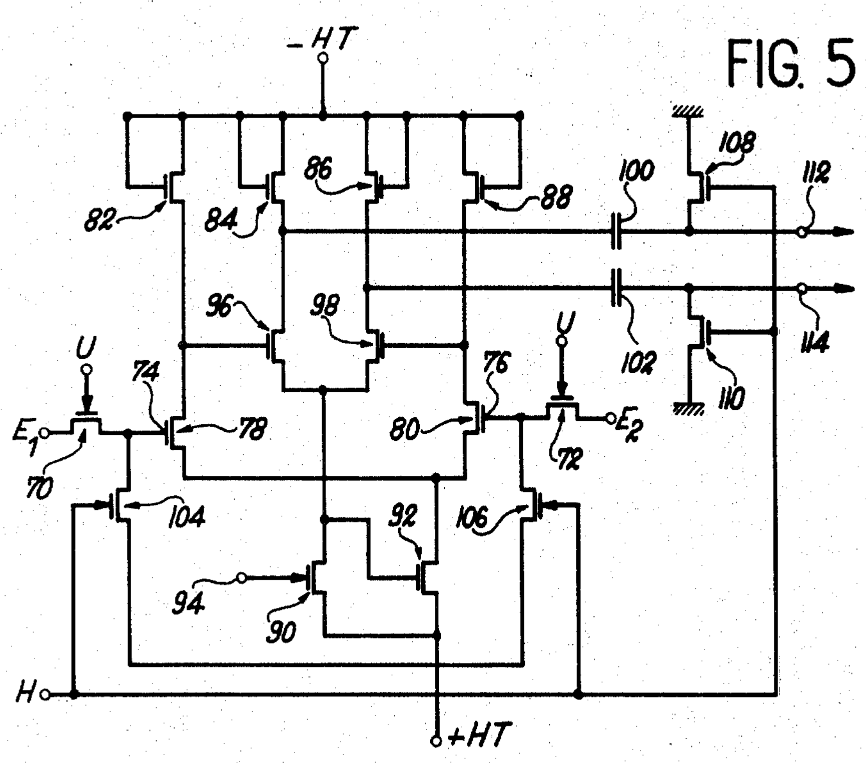
FIG. 5 shows by way of example the circuit diagram of one embodiment of the input and of the first amplifier stage of a device according to the invention.

FIG. 5 shows by way of example the input and the first amplifier stage of an integrated amplifying device according to the invention as constructed in accordance with the MOS technology. The input signals of opposite polarities are injected into the two inputs $E_1$ and $E_2$. These latter are put into service or out of service by means of transistors 70 and 72. The grids of these transistors represent the input U of the diagram of FIG. 4. The two inputs of the amplifier stage are formed by the grids 74 and 76 of the two transistors 78 and 80. This amplifier stage is in fact a double differential stage of conventional type. The four transistors 82, 84, 86 and 88 are the load transistors of this double stage. They are supplied with voltage from the negative high-tension terminal -HT. The two transistors 90 and 92 form the current generators for this stage, the grid 94 of the transistor 90 being placed at a suitable bias-voltage level and their "source" electrodes being biased at a positive voltage +HT. The four transistors 78, 80, 96 and 98 carry out the amplification of the signals applied to the inputs $E_1$ and $E_2$. The capacitors 100 and 102 effect the storage and compensation for the offset voltage of this double differential stage. The two input transistors 104 and 106 form two switches which serve to connect the two inputs 74 and 76 of the double differential stage during the storage and compensation operation. The two transistors 108 and 110 corresponding to the two switches 36 and 38 of the diagram of FIG. 4 permit the last-mentioned operation either by connecting or not connecting to ground one of the two terminals of each capacitor 100 and 102. The output of this first amplifier stage is represented in the diagram by the terminals 112 and 114 which are connected to the two inputs of the second amplifier stage (not shown). The recurrent signals which permit the successive operations of storage and compensation are applied to the input H.

By way of example, an integrated amplifying device in accordance with the invention can have an offset voltage in the vicinity of 50 $\mu$V and an input impedance higher than $10^{11}$ ohms. In this range of values, there are at present in existence only modular circuits which operate either by frequency modulation by means of diodes of the "Varicap" type, or by means of optical modulators (choppers), these amplifiers being both costly and cumbersome. It may be considered in particular that, for equal performances, an amplifying device in accordance with the invention is approximately 20 to 40 times less expensive to produce than an amplifier of the prior art. Moreover, the amplifying devices according to the invention offer many advantages by reason of the fact that they can very readily be constructed in the form of integrated circuits and particularly in the MOS technology.

The time which is necessary in order to carry out the operation involving storage and compensation for the offset voltage and which is very short compared with the time of utilization of the amplifying device is usually not perceptible by the user. However, if this time of non-utilization of the device were to prove troublesome, the output voltage of the device can be placed in storage during the second portion of the utilization phase and can then be restored during this very short time interval, which avoids the need to have a zero output voltage.

It is readily apparent that the present invention is not limited solely to the embodiments which have been described with reference to the accompanying drawings and have been given solely by way of explanatory example but not in any sense by way of limitation. In particular, the diagrams of FIGS. 4 and 5 represent only particular forms of construction and the numerical values have been given only by way of example.

What we claim is:

1. An amplifying device of the integrable type and having low drift, wherein said device comprises *n* amplifying stages placed in cascade and each comprising means for storing a value substantially proportional to the offset voltage of such stage and compensating for said offset voltage, and means for controlling the said storage and compensation means to carry out the storage and compensation operations successively stage by stage in such manner that each stage compensates for the imperfections of storage of the preceding stages, the input of the first stage constituting the input of said device being the only input of a stage with means to cancel out the input voltage during said storage and compensation operation.

2. A device according to claim 1, wherein said means for controlling are provided with switches connected in parallel to each other by means of delay circuits so as to produce a relative displacement in time between the opening and closure of the switches belonging to successive stages, recurrent electric signals being applied to the circuit for controlling the first switch.

3. A device according to claim 1, wherein the stage having the order (n) comprises two amplifiers connected in cascade, wherein said storage and compensation means for the stage having the order (n) are constituted by a capacitor connected between said amplifiers of such stage, and wherein said control means comprise a switch for placing the output of the second amplifier of said stage having the order (n) in total negative feedback with the input thereof during said storage operation.

4. A device according to claim 1, wherein the amplifiers of the n stages are of the differential type having two inputs and two outputs of opposite polarity, each of the two channels of each amplifier being provided with a circuit for storage and compensation, said control means comprising means to connect each of the two inputs of the n amplifiers to ground by means of a switch and delay means controlling the opening or closure of said switches to produce a relative displacement in time between the opening and closure of the switches of successive stages and closing the switches of the same stage concurrently, and means to apply recurrent electric signals to said delay means to effect recurrent operation thereof.

5. A device according to claim 1, wherein said control means comprise switches in the form of MOS transistors connected between the input of each stage and ground.

6. A device according to claim 1 wherein said device is constructed in accordance with the MOS technology.

7. A method of compensation for the offset voltage of an amplifying device composed of a plurality of amplifier stages each with means for storing a value to compensate for the offset voltage of such stage, wherein said method comprises connecting said amplifier stages in cascade and, for each stage in turn, storing a value in the storage means of such stage compensating for the offset voltage of such stage and compensating for the imperfections of storage of the preceding stages.

8. A method according to claim 7, wherein the storage and compensation operation for all the stages aforesaid is carried out periodically with a frequency which is higher than the frequencies constituting the noise frequncy band of said amplifier stages.

* * * * *